United States Patent
Zhou et al.

(10) Patent No.: US 9,222,994 B2
(45) Date of Patent: Dec. 29, 2015

(54) PERPENDICULAR SPIN TORQUE OSCILLATOR FMR FREQUENCY MEASUREMENT METHOD

(75) Inventors: Yuchen Zhou, San Jose, CA (US); Kunliang Zhang, Fremont, CA (US); Min Li, Fremont, CA (US); Kenichi Takano, Saku (JP); Joe Smyth, Aptos, CA (US); Moris Dovek, San Jose, CA (US); Akihiko Takeo, Kunitachi (JP); Tomomi Funayama, Fuchu (JP); Masahiro Takashita, Kawasaki (JP); Masayuki Takagishi, Kunitachi (JP)

(73) Assignees: TDK Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 1101 days.

(21) Appl. No.: 13/200,148

(22) Filed: Sep. 19, 2011

(65) Prior Publication Data

US 2013/0069626 A1    Mar. 21, 2013

(51) Int. Cl.
| | |
|---|---|
| G01R 23/02 | (2006.01) |
| G01R 33/12 | (2006.01) |
| G11B 5/39 | (2006.01) |
| H01L 43/08 | (2006.01) |
| G11C 11/16 | (2006.01) |

(52) U.S. Cl.
CPC .......... *G01R 33/1284* (2013.01); *G11B 5/3903* (2013.01); *G11C 11/161* (2013.01); *G11C 11/1675* (2013.01); *H01L 43/08* (2013.01)

(58) Field of Classification Search
None
See application file for complete search history.

(56) References Cited

U.S. PATENT DOCUMENTS

| 7,471,491 B2 | 12/2008 | Sato et al. | |
| 7,616,412 B2 | 11/2009 | Zhu et al. | |
| 7,652,915 B2 | 1/2010 | Folks et al. | |
| 7,965,474 B2 | 6/2011 | Sato et al. | |
| 2008/0074806 A1* | 3/2008 | Sato et al. | 360/324.11 |
| 2009/0201614 A1 | 8/2009 | Kudo et al. | |
| 2009/0310244 A1 | 12/2009 | Shimazawa et al. | |
| 2010/0079919 A1* | 4/2010 | Nagasawa et al. | 360/324.1 |
| 2010/0328799 A1* | 12/2010 | Braganca et al. | 360/31 |

* cited by examiner

*Primary Examiner* — Melissa Koval
*Assistant Examiner* — Stephen G Armstrong
(74) *Attorney, Agent, or Firm* — Saile Ackerman LLC; Stephen B. Ackerman

(57) ABSTRACT

A method for measuring the frequency in a spin torque oscillator having at least a magnetic oscillation layer (MOL), junction layer, and magnetic reference layer (MRL) is disclosed. In a first embodiment, a small in-plane magnetic field is applied to the STO after a DC current is applied to excite the MOL into an oscillation state. The MRL has a perpendicular magnetization that is tilted slightly to give an in-plane magnetization component to serve as a reference layer for measuring the oscillation frequency of the MOL in-plane magnetization component. An AC voltage change is produced in the DC current as a result of variable STO resistance and directly correlates to MOL oscillation frequency. Alternatively, a field having both perpendicular and in-plane components may be applied externally or by forming the STO between two magnetic poles thereby producing an in-plane magnetization reference component in the MRL.

20 Claims, 5 Drawing Sheets

PERPENDICULAR SPIN TORQUE OSCILLATOR FMR FREQUENCY MEASUREMENT METHOD

FIELD OF THE INVENTION

The invention relates to a perpendicular spin torque oscillator (PSTO) used for thin film applications such as a RF field generator in a magnetic recording device, and in particular to a method for determining the PSTO oscillation frequency without causing any permanent change in the PSTO structure or to the magnetic oscillator layer (MOL) behavior therein.

BACKGROUND OF THE INVENTION

Spin transfer (Spin torque) devices are based on a spin-transfer effect that arises from the spin dependent electron transport properties of ferromagnetic-spacer-ferromagnetic multilayers. When a spin-polarized current transverses a magnetic multilayer in a CPP (current perpendicular to plane) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. Spin transfer devices also known as spintronic devices wherein at least one of the ferromagnetic layers in a magnetoresistive (MR) junction has perpendicular magnetic anisotropy have an advantage over devices based on in-plane anisotropy in that they can satisfy the thermal stability requirement but also have no limit of cell aspect ratio. As a result, spin valve structures based on PMA are capable of scaling for higher packing density which is a key challenge for future MRAM (Magnetoresistive Random Access Memory) applications and other spintronic devices such as microwave generators.

A spin torque oscillator (STO) is a magneto-resistive (MR) thin film device which can have an induced RF frequency magnetization oscillation within at least one of the magnetic layers of the device by applying an electrical current. As described in U.S. Pat. No. 7,616,412, an STO may be used as a high Q factor RF signal generator if the oscillating magnetization is transformed into resistance fluctuations through a MR effect. In U.S. Patent Application Pub. 2009/0310244, STO is employed as a RF magnetic field generator to assist a magnetic recording process in a magnetic recording device. A STO comprises at least three layers including a magnetic oscillating layer (MOL), a magnetic reference layer (MRL), and a non-magnetic spacer sandwiched between the MOL and MRL. When electrons transit the MRL and become polarized, the polarized electrons then pass through the non-magnetic spacer and through the MOL to induce a gyromagnetic oscillation also known as ferromagnetic resonance (FMR) in the MOL. A PSTO (perpendicular spin torque oscillator) is a version of an STO wherein the MRL has perpendicular magnetic anisotropy (PMA) and is magnetized in a direction perpendicular to planes of the junction layers. With a perpendicular magnetization of the MRL, a full amplitude in-plane oscillation of the MOL can be achieved.

Referring to FIG. 1, a PSTO structure is depicted from U.S. Pat. No. 7,616,412 and includes MRL 1 that has intrinsic anisotropy which keeps its magnetization perpendicular to the film plane, non-magnetic junction layer 2, and MOL 3. Layers 1-3 constitute the PSTO component 11 of the stack. There are other layers 4-8 above the MOL 3 for sensing the magnetization oscillation of the MOL. In particular, second junction layer 4, reference layer 5 with in-plane magnetization, non-magnetic exchange layer 6 typically made of Ru, and pinned layer 7 are sequentially formed on PSTO stack 11. Layers 5-7 comprise a generic synthetic anti-ferromagnetic (SAF) configuration commonly used in commercial giant magnetoresistive (GMR) or tunneling magnetoresistive (TMR) sensors. Anti-ferromagnetic layer 8 pins reference layer 5 and pinned layer 7 through exchange coupling. During an operating mode, electrons flow through the entire stack from top electrical contact 22 to bottom electrical contact 21. As a result of the spin torque effect, electrons passing through the junction layer 2 excite MOL 3 magnetization from a quiescent state into an oscillation state.

PSTO 11 is intrinsically a MR junction in which relative magnetization angle change between layers 1 and 3 will produce a resistance change across stack 11 that can be measured as a voltage signal when a current flows through the stack. However, when MOL 3 reaches a stable magnetic oscillation with a significant amount of in-plane magnetization component, the relative angle between the magnetizations of MRL 1 and MOL 3 does not really change which makes the detection of the actual FMR frequency of MOL 3 hard to achieve when only measuring the resistance between the MRL and MOL. For FMR or RF voltage signal generation purposes, the prior art utilizes SAF and AFM layers above MOL 3 where reference layer 5 serves to generate a MR resistance change during MOL magnetization oscillation. Therefore, layers 3-5 form another MR junction wherein the relative magnetization angle change between MOL 3 and reference layer 5 produces an effective resistance. As current flows between contacts 21 and 22, a voltage signal reflecting MOL layer magnetization oscillation can be produced across the entire stack.

However, there are disadvantages associated with the prior art as pictured in FIG. 1. First of all, the additional layers 4-8 above MOL 3 significantly increase the overall stack thickness and thereby limit its feasibility in thin film applications as in a magnetic recording device. Secondly, the spin torque effect from the top MR junction that is comprised of layers 3-5 for sensing the MOL 3 oscillation interferes with the spin torque effect of the bottom junction of the STO stack 11 so that MOL oscillation quality is degraded by the presence of the SAF layers 5-7 and AFM layer 8.

Referring to FIGS. 2a-2b and FIGS. 3a-3b, micro-magnetic simulations are shown for a PSTO comprised of stack 11 only (FIGS. 2a, 3a) and for a PSTO that includes all layers 1-8 in FIG. 1 as depicted in FIGS. 2b, 3b. FIG. 2a is the oscillation time trace of the in-plane magnetization component for MOL in stack 11 only, and FIG. 2b is a similar oscillation time trace for a PSTO having all layers 1-8. FIG. 3a and FIG. 3b are the corresponding power-spectrum-density (PSD) plots of the time traces in FIGS. 2a, 2b, respectively, where the FMR peak represents the frequency and power of the oscillation. For a top junction, SAF and AFM layers are included in a PSTO stack as represented in FIGS. 2b, 3b, and MOL oscillation shows irregular behavior and lower power than in the case of PSTO stack 11 only. Therefore, the additional layers 4-8 are useful in acquiring oscillation information of the MOL 3, but the second (top) MR junction also changes the MOL oscillation behavior. The change to irregular oscillations and lower power is especially not desirable when uniform and high power MOL oscillation is required on a continuous basis for optimum performance while characterization of oscillation frequency is only needed occasionally, for example, when the PSTO is used as a RF field generator in a magnetic recording device.

For read out of PSTO MOL oscillation frequency through PSTO resistance, the prior art also describes using a MRL with vertical and in-plane anisotropy to achieve a tilted MRL magnetization as shown in FIGS. 1c, 1d of U.S. Pat. No. 7,616,412. In-plane anisotropy keeps the MRL magnetization at an angle less than 90 degrees to the film plane to provide a reference magnetization direction for MOL oscillating magnetization. However, this approach requires development of two anisotropy axes in the magnetic MRL film, and a MRL film structure that is more complicated than needed in situations where a simple PSTO structure with perpendicular MRL is desired as in examples where a PSTO serves as a RF magnetic field generator in a magnetic recording device. Furthermore, in-plane anisotropy as an intrinsic property of the MRL remains present even when the MOL frequency of a PSTO is not being characterized.

In U.S. Pat. No. 7,471,491, an external in-plane field is used to shift an existing FMR mode from a low frequency to a higher frequency and the amount of the shift is related to in-plane field magnitude that a sensor experiences. As a result, the prior art uses this scheme to read out the magnetic bits from a magnetic recording medium. Output is measured through a system consisting of a waveguide connected through a probe to a bias and amplifier and then to a noise spectrum analyzer.

U.S. Patent App. Publication 2009/0201614 discloses a hybrid spin torque oscillator having a separate oscillating field generating unit that supplies an oscillating field through magnetostatic coupling to a magnetoresistive (MR) element. When a DC current is applied to the MR element in the presence of the oscillating field, magnetic resonance occurs in the MR free layer. An AC component is formed by device resistance variation as a function of time and is extracted by a bias tee formed with a capacitor and an inductor to obtain a microwave output.

U.S. Pat. No. 7,652,915 describes a method for measuring resonant frequency in a MR element after a DC current is applied.

U.S. patent app. Publication discloses a spin torque oscillator without an additional MR element but a method of measuring oscillating frequency is not discussed.

SUMMARY OF THE INVENTION

One objective of the present invention is to provide a method of characterizing PSTO MOL oscillation frequency by detecting the resistance change of the PSTO without relying on a secondary MR junction that interferes with MOL oscillation and by employing a MRL having only perpendicular magnetic anisotropy (PMA).

A second objective of the present invention is to provide a method for characterizing MOL oscillation frequency in a PSTO that does not require an additional device such as an oscillating field generator unit that would limit PSTO density on the substrate.

According to one embodiment of the present invention, these objectives are achieved by exciting a MOL into an oscillation state with a current directed perpendicular to the planes of the PSTO layers and then applying a small in-plane magnetic field to the PSTO device comprised of a MOL/junction/MRL configuration with a magnitude that is small enough such that the oscillation mode of the MOL is not significantly changed and the MOL maintains an oscillation amplitude and frequency essentially the same as under a no-field condition. The junction layer may be a non-magnetic conductive layer. Furthermore, the applied field should be strong enough to tilt the perpendicular magnetization of the MRL (reference layer) by a certain amount so that the MRL has an in-plane component to provide a reference direction for MOL oscillation. With the small in-plane reference magnetization, MOL oscillation can then produce a measurable resistance change as detected by a voltage signal when a DC current flows through the PSTO from a bottom contact to a top contact in a path perpendicular to the planes of the MRL and MOL. Frequency of the AC voltage change reflects the MOL oscillation frequency. In other words, an AC component is formed in the direct current from the bottom contact as a result of MOL oscillation, and is subsequently extracted after exiting the top contact by a bias tee consisting of a capacitor and an inductor, for example, to generate a measurable microwave output.

In a second embodiment, the features of the first embodiment are retained except the applied field to the PSTO device is a strong field that consists of a large field component perpendicular to the planes of the MOL and MRL, and a smaller field component formed in the in-plane direction wherein the smaller field component has a magnitude which is less than about 30% that of the large field component. The large field component is relied upon to assist the magnetic oscillating layer to reach the desired oscillating mode while the smaller field in-plane component tilts the perpendicular magnetization of the MRL by a small amount to establish an in-plane MRL magnetization component as in the first embodiment.

According to a third embodiment, the strong magnetic field in the second embodiment is replaced by a magnetic field that is applied by a pair of soft magnetic poles formed above and below the PSTO. Preferably, a non-magnetic conductive layer separates a top surface of the PSTO from a first magnetic pole, and a second non-magnetic conductive layer separates a bottom surface of the PSTO from the second magnetic pole. Top and bottom electrical contacts mentioned previously in the first embodiment may be directly connected to the magnetic poles or the magnetic poles may serve as the electrical contacts to establish an electrical pathway in a CPP direction through the PSTO stack. Furthermore, the magnetic poles may be part of an electromagnet thereby producing a magnetization direction therein that is mostly perpendicular to the plane of the PSTO layers when a current is applied to the electromagnet. The pole magnetization orientation thereby generates magnetic charges facing the top and bottom surfaces of the PSTO and the resulting magnetic field comprises a large component perpendicular to the MRL and MOL film planes, and a small component in the film planes which tilts the MRL magnetization. In another embodiment, the two magnetic poles may be magnetized by an externally applied magnetic field wherein the external field flux is conducted by the soft magnetic poles and into the gap between the two magnetic poles to produce the required magnetic field on the PSTO stack.

DETAILED DESCRIPTION OF THE INVENTION

The present invention is a method relating to the measurement of oscillation frequency in a PSTO device. The perpendicular spin torque oscillator may be employed as a RF field generator in a magnetic recording head for microwave assisted magnetic recording (MAMR) or may be used in other applications such as a reference oscillator or directional microwave transmitter in devices including cell phones, radar systems, and computer chips. Furthermore, in a magnetic recording head device, the PSTO may have a so-called "top" or "bottom" configuration determined by whether the MOL in the MRL/spacer/MOL stack is formed closer to the main pole than the MRL, or if the opposite is true. The magnetic oscillation layer (MOL) as described herein may be considered a "free" ferromagnetic layer in that its magnetization orientation is free to change (oscillate) in the presence of a direct current flowing perpendicular to the plane of the MOL. The junction layer in the PSTO stack may also be referred to as a non-magnetic spacer. An "in-plane" magnetic field is defined as one that is applied parallel to the planes of the PSTO layers. A perpendicular component of a magnetic field refers to a field that is applied in a direction perpendicular to the planes of the PSTO layers.

Various embodiments of the present invention will now be described with regard to FIGS. 4, 8, and 9. In particular, all embodiments share a common feature in that an applied magnetic field having at least an in-plane component with respect to the planes of the PSTO layers is used to tilt the perpendicular magnetization of a reference layer (MRL) in the PSTO stack and the resulting in-plane magnetization component serves as a reference for determining the oscillation frequency in the MOL. The magnetic field is applied simultaneously with a direct current flowing from a bottom contact through the PSTO to a top contact during a measurement mode wherein MOL frequency is characterized but not significantly altered from a condition when no field is applied. Thereafter, the in-plane magnetic field is removed and the PSTO returns to normal operating mode with no disruption of performance.

Figure 1:
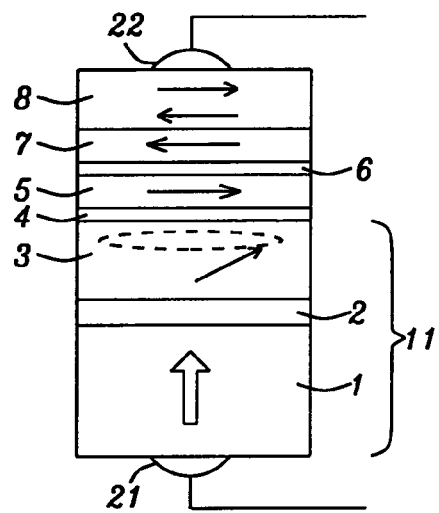
FIG. 1 is a cross-sectional view of a prior art PSTO structure in which magnetization oscillation frequency is sensed by means of an additional stack of layers formed above the PSTO stack.
Figure 2A:
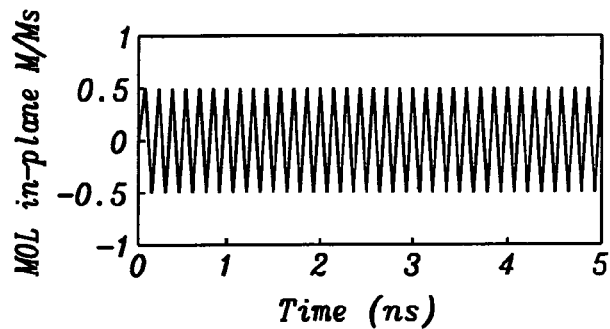
FIG. 2a is a plot showing an oscillation time trace of the in-plane magnetization component of the MOL layer for stack 11 (FIG. 1) only.
Figure 2B:
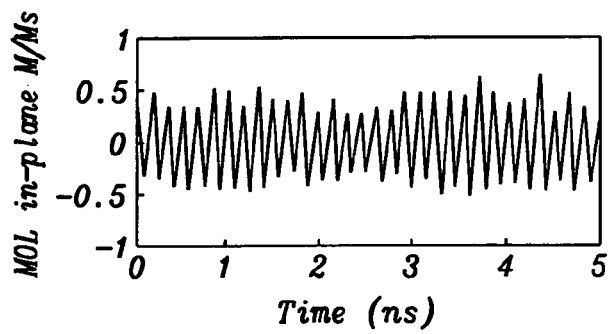
FIG. 2b is a similar oscillation time trace for all layers in FIG. 1 between upper and lower contacts.
Figure 3A:
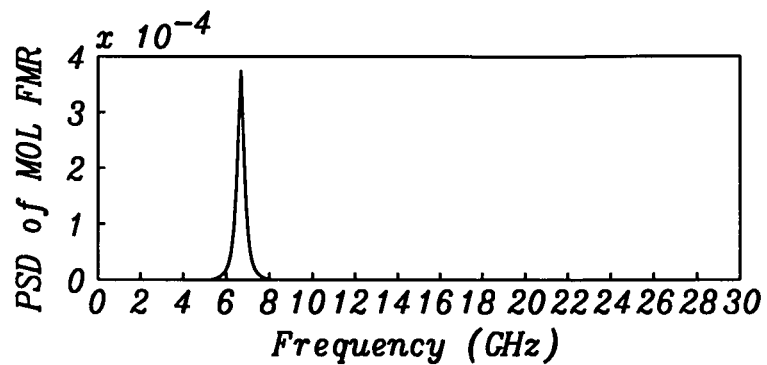
FIG. 3a is the corresponding power-spectrum-density (PSD) of the time trace in FIG. 2a, and FIG. 3b is the corresponding PSD of the time trace in FIG. 2b where the FMR peak represents the frequency and power of the oscillation.
Figure 3B:
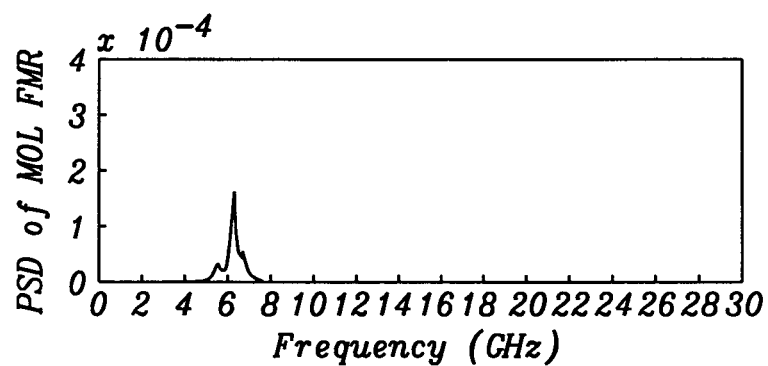
Figure 4:
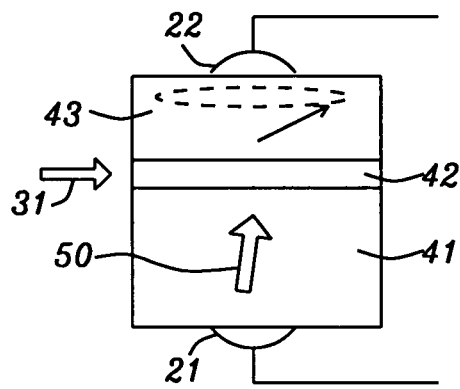
FIG. 4 is a cross-sectional view of a PSTO and a small magnetic field being applied in a film plane while DC current is applied between upper and lower contacts as a method of measuring MOL magnetization oscillation frequency according to a first embodiment of the present invention.

Referring to FIG. 4, a first embodiment of the present invention is depicted and relates to a PSTO comprised of at least a MRL 41, MOL 43, and a non-magnetic spacer 42 that form a MRL/spacer/MOL configuration wherein the MRL is connected to a first electrical contact 21, and the MOL is connected to a second electrical contact 22. Electrical contacts 21, 22 may be comprised of an electrical lead, a metal via, or a conductive line, for example. Preferably, MRL 41 has perpendicular magnetic anisotropy (PMA) whereby its magnetization direction is oriented perpendicular to the planes of the PSTO layers in the absence of a magnetic field. For optimum PSTO performance, the MRL is comprised of a material that generates a high PMA value so that a high magnetoresistance ratio (MR) is realized during a normal operating mode. Moreover, the MRL may be a laminated layer in order to achieve a high PMA value. It should be understood that additional layers may be formed between MRL 41 and first contact 21 such as a seed layer (not shown) which promotes a higher PMA in the MRL.

In one aspect, the spacer 42 may be made of a conductive material such as Cu to give a giant magnetoresistive (GMR) element. In another embodiment, the spacer may comprise a well known GMR-CCP design with current confining pathways such as Cu formed in an oxide matrix that may be aluminum oxide, for example. Alternatively, the spacer 42 may be comprised of a dielectric material such as AlOx, MgO, TiOX, or the like in a tunneling magnetoresistive (TMR) scheme. Preferably, MOL 43 is comprised of a soft magnetic material having in-plane anisotropy or at least an in-plane magnetization component. Moreover, there may be a capping layer (not shown) formed between MOL 43 and second contact 22 to serve as an etch stop or chemical mechanical polish (CMP) stop layer during device fabrication.

When a DC current is applied and flows from first contact 21 to second contact 22, a spin torque effect leads to in-plane magnetization oscillation with a certain amplitude and frequency within MOL 43. A key feature of a first embodiment of the present invention is that MOL oscillation frequency may be measured by a method wherein a small amplitude magnetic field 31 having a strength between 10 and 3000 Oe is applied entirely in an in-plane direction. The applied magnetic field 31 tilts the magnetization 50 of MRL 41 to generate a small in-plane magnetization component. The resulting magnetization 50 includes the small in-plane component that provides a reference direction for MOL oscillation, and a large PMA component. Oscillation frequency in MOL 43 is then determined by measuring the AC voltage signal frequency between the two contacts 21, 22. Thus, the frequency of the AC voltage change as a result of resistance variation due to MOL oscillation corresponds to the oscillation frequency. It is important that the applied in-plane field not be so large as to significantly alter the MOL oscillation amplitude and frequency thereby avoiding a prior art condition wherein the oscillation becomes unstable and non-uniform.

Figure 5A:
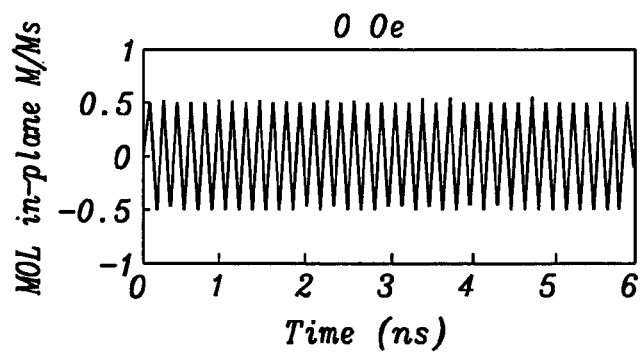
FIGS. 5a, 5b show a plot of simulated in-plane magnetization oscillation time trace with no magnetic field and 500 Oe, respectively, applied in-plane to a PSTO stack according to a first embodiment of the present invention.
Figure 5B:
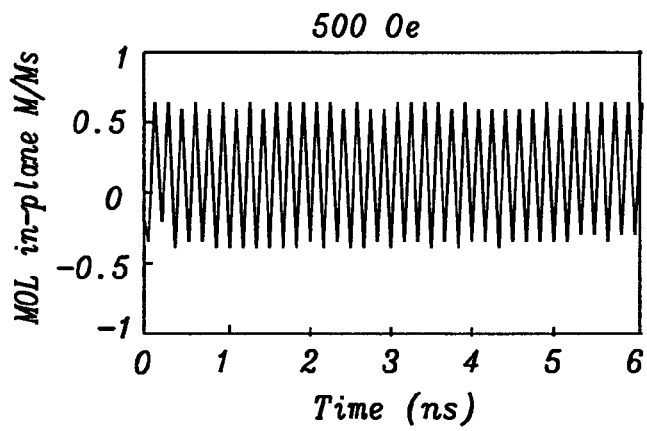
Figure 6A:
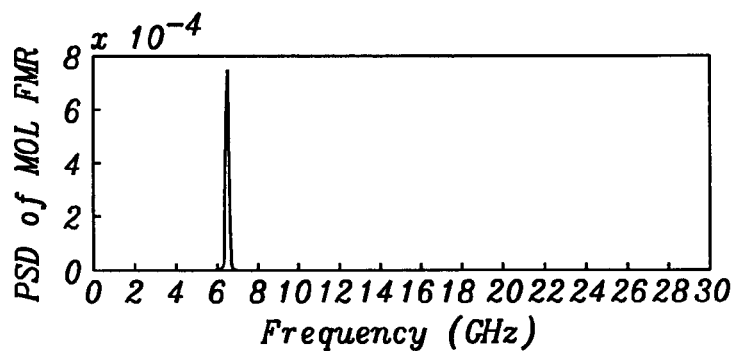
FIGS. 6a, 6b are the corresponding PSD of the in-plane magnetization time traces in FIGS. 5a, 5b, respectively.
Figure 6B:
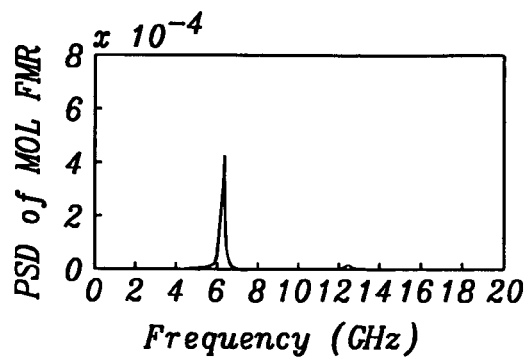

In FIGS. 5a, 5b, a simulated in-plane oscillation time trace is shown for an MOL according to the first embodiment of the present invention wherein 0 Oe and 500 Oe fields, respectively, are applied in-plane to the PSTO device. Note that FIG. 5b displays essentially the same oscillation mode as depicted in FIG. 5a, and with a small magnetization bias in the positive direction due to the applied field. FIGS. 6a, 6b are the corresponding PSD of the in-plane magnetization traces in FIGS. 5a, 5b, respectively. In the example of a 500 Oe applied field (FIG. 6b), MOL oscillation frequency is substantially the same as in the 0 Oe case (FIG. 6a) but with a certain drop in amplitude. However, the PSTO will still be operative and MOL performance will return to a condition represented in FIGS. 5a, 6a after the frequency characterization measurement is completed and the applied in-plane field is removed.

Figure 7A:
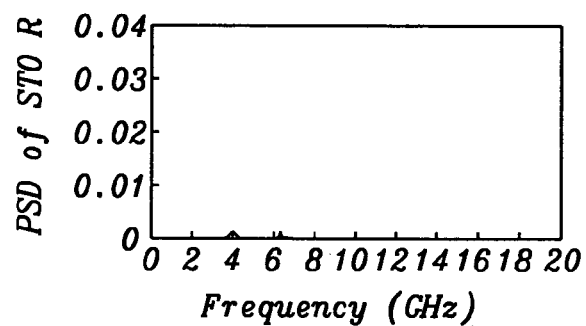
FIGS. 7a, 7b show the corresponding voltage signal PSD measured between top and bottom contacts for the 0 Oe and 500 Oe magnetic field conditions in FIGS. 5a and 5b, respectively.
Figure 7B:
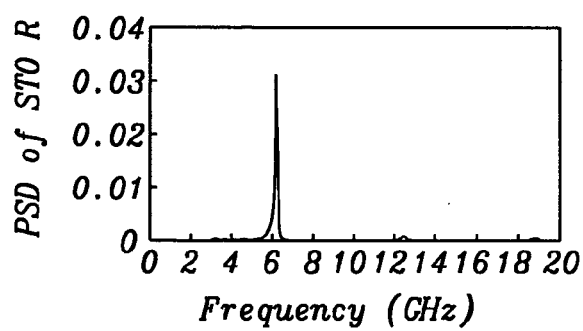

Referring to FIGS. 7a, 7b, the corresponding voltage signal PSD is illustrated as measured between electrical contacts 21, 22 for the 0 Oe and 500 Oe applied field examples, respectively. In the absence of an applied field (FIG. 7a), the voltage signal across the PSTO does not produce any measurable signal that relates to the MOL oscillation frequency even though the actual oscillation is stronger than in the 500 Oe (FIG. 7b) example. The strong MOL oscillation during the zero applied field condition occurs because relative angle change between MOL and MRL during the oscillation state is approximately zero which means the effective resistance across the junction is stable with no measurable change and therefore no AC voltage signal is generated. On the other hand, FIG. 7b demonstrates that by using a method of the present invention in which a small in-plane field is applied during MOL oscillation, the resulting small in-plane component of MRL magnetization serves as a reference so that there is a relative angle change between MOL and MRL during oscillation that will produce a variable resistance across the junction. The variable resistance causes an AC voltage change that is directly related to MOL oscillation frequency. Therefore, an AC voltage change across the junction enables a determination of oscillation frequency which is around 6 GHz in the 500 Oe applied field example. Furthermore, PSTO oscillation frequency is successfully measured without any permanent change of the STO structure or MOL behavior because the applied field is removable and PSTO performance then returns to its original state before the frequency characterization method was initiated.

Those skilled in the art will appreciate that more than one method may be used to measure an AC component in a DC current as produced during a characterization method of the present invention. According to one technique, the AC component is extracted by connecting top contact 22 to a bias tee made of an inductor and capacitor, and a microwave output is thereby measured. The present invention does not rely on any single method to measure an AC voltage output. Instead, the key feature is the method by which an AC voltage output that relates to MOL oscillation frequency is generated without disrupting the performance of a PSTO device or adding additional layers to the PSTO stack.

Figure 8:
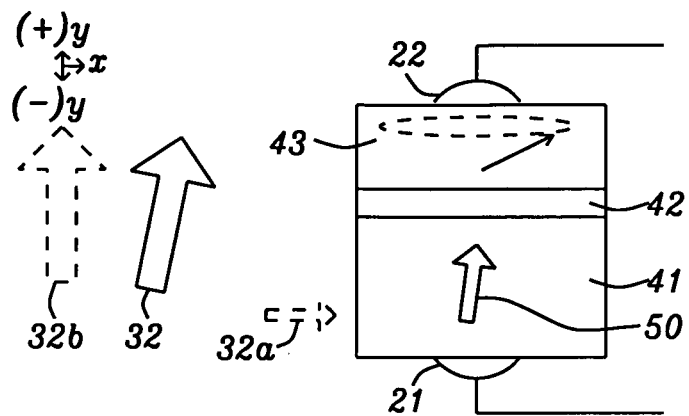
FIG. 8 is a cross-sectional view of a PSTO and an applied magnetic field comprised of a large perpendicular and small in-plane component while DC current is applied between upper and lower contacts as a method of measuring MOL magnetization oscillation frequency according to a second embodiment of the present invention.

Referring to FIG. 8, a second embodiment of the present invention is shown wherein all PSTO features of the first embodiment are retained, but the applied magnetic field is modified to include a relatively large perpendicular component. In particular, applied magnetic field 32 is comprised of a large perpendicular component 32a that assists in establishing an oscillation state in MOL 43, and a small in-plane component 32b which tilts the magnetization 50 of MRL 41 to generate a small in-plane magnetization therein. According to one embodiment, in-plane field 32b is in the range of 10 to 3000 Oe which represents 30% or less of the total strength of magnetic field 32. Perpendicular field 32a may be applied in a (+) y-axis direction which is a direction from MOL toward MRL or in a (−) y-axis direction that is from MRL toward MOL. MOL 43 is excited into an oscillation state as in the first embodiment by flowing a DC current from first contact 21 to second contact 22. Thereafter, MOL frequency is measured during application of the applied field 32 to generate a small in-plane component of MRL magnetization 50 that serves as a reference for MOL oscillation as described in the first embodiment. When MOL oscillation frequency is determined, the applied field 32 is removed and the PSTO returns to normal operating mode with no change in performance. Moreover, the MOL oscillation frequency and amplitude are maintained from their original 0 Oe applied field condition and MRL magnetization 50 returns to include only a PMA component.

Figure 9:
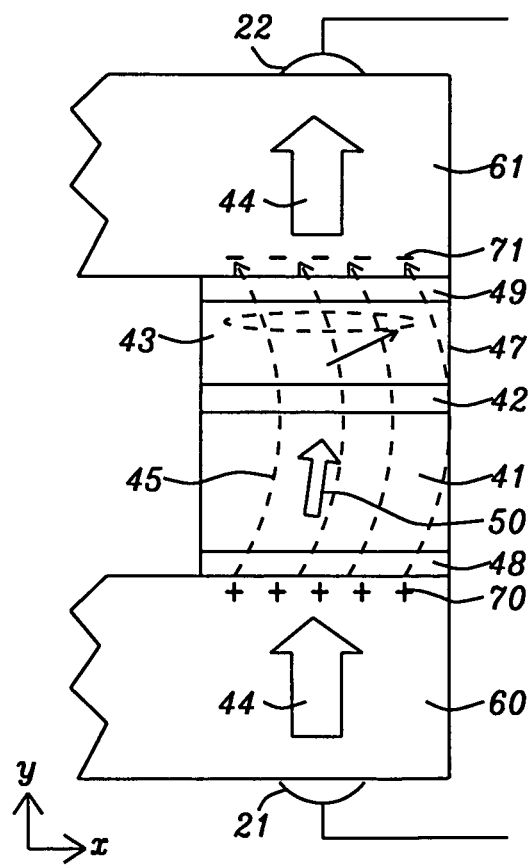
FIG. 9 is a cross-sectional view of a third embodiment of the present invention wherein magnetic poles formed above and below a PSTO are employed to generate a magnetic field as part of a method to measure MOL oscillation frequency.

Referring to FIG. 9, a third embodiment of the present invention is depicted and represents a modification of the second embodiment wherein the strong magnetic field 32 is replaced by a strong magnetic field 45 applied by a pair of soft magnetic poles 60, 61 below and above the PSTO stack of layers 41-43 and having a magnetization component 44. Magnetic field 45 is applied in a direction from magnetic pole 60 to magnetic pole 61 or in a reverse direction by reversing the direction of magnetization component 44.

In the exemplary embodiment, the magnetic poles 60, 61 are separated from MRL 41 and MOL 43, respectively, by a non-magnetic conductive spacer. In particular, there is a first conductive spacer 48 sandwiched between magnetic pole 60 and MRL 41, and a second conductive spacer 49 formed between MOL 43 and magnetic pole 61. Thus the first conductive spacer is formed on a side of MRL that is opposite the interface of MRL with junction layer 42, and the second conductive spacer is formed on a side of MOL that is opposite the interface of MOL with the junction layer. In one aspect, the PSTO layers 41-43 and magnetic poles have a common sidewall 47 that is essentially planar. Sidewall 47 may be vertical (parallel to the y-axis) or sloped such that the first conductive spacer has a greater or lesser width along the x-axis direction than the second conductive spacer. Furthermore, electrical contacts 21, 22 are directly connected to magnetic poles 60, 61, respectively.

In an alternative embodiment, magnetic poles 60, 61 may serve as the electrical contacts so that contacts 21, 22 are not required. According to one embodiment, the magnetic poles are part of an electromagnet (not shown) which makes pole magnetization 44 mainly perpendicular to the planes of the PSTO layers 41-43 when a current is applied to the electromagnet. The magnetization orientation of the magnetic poles 60, 61 then generates magnetic charges of opposite sign proximate to the top and bottom surfaces of the PSTO. In other words, there may be positive charges 70 formed at the top surface of magnetic pole 60 that interfaces with first conductive spacer 48, and negative charges 71 formed at the bottom surface of magnetic pole 61 that interfaces with second conductive spacer 49. Due to the physical structure of the magnetic poles, the magnetic field 45 from the magnetic charges is a strong field having a large component perpendicular to the film plane and a small component in the film plane to tilt magnetization 50 in MRL 41 such that MRL has a small in-plane component. Note that the field 45 is bent due to symmetry in the space between the conductive spacers 48, 49 and in particular, within STO layers 41-43. In one embodiment, the in-plane component of magnetic field 45 is from about 10 Oe to 3000 Oe.

The present invention also encompasses an embodiment wherein magnetization of magnetic poles 60, 61 is accomplished by applying an external magnetic field (not shown) wherein the external field flux is then conducted by the soft magnetic poles into the gap or space between the two poles to produce the required magnetic field with large perpendicular and small in-plane components as described above.

According to the third embodiment, MOL 43 is excited into an oscillation state similar to the first and second embodiments by flowing a DC current from first contact 21 to second contact 22 (or from magnetic pole 60 to magnetic pole 61).

Thereafter, MOL frequency is measured during application of the applied field 45 to generate a small in-plane component of MRL magnetization 50 that serves as a reference for MOL oscillation. After MOL oscillation frequency is determined by measuring an AC voltage change across the PSTO device, the applied field 45 is removed and the PSTO returns to normal operating mode with no change in STO performance. Moreover, the MOL oscillation frequency and amplitude are maintained from their original 0 Oe applied field condition and MRL magnetization 50 returns to include only a PMA component. Thus, the MOL oscillation frequency method described herein has no detrimental affect on PSTO performance. It should be understood that the frequency (i.e. AC voltage output) varies depending on the magnitude of the perpendicular component of the applied field, and in some cases the oscillation may stop if the perpendicular component becomes too large.

The embodiments of the present invention provide an advantage over the prior art in that MOL oscillation frequency is readily determined with a simple PSTO structure involving a single magnetic junction without the need for a second MR sensor, process complications, or degraded STO quality. The measurement method is versatile since the required magnetic field may be applied externally or by poles attached to the PSTO. Furthermore, the present invention encompasses an embodiment wherein the aforementioned magnetic field may be applied simultaneously to a plurality of PSTO devices to enable multiple oscillation frequency measurements during the same time period.

While this invention has been particularly shown and described with reference to, the preferred embodiment thereof, it will be understood by those skilled in the art that various changes in form and details may be made without departing from the spirit and scope of this invention.

We claim:

1. A method to characterize the frequency of a spin torque oscillator (STO), comprising:
   (a) providing a STO including at least a magnetic reference layer (MRL) having a film plane, a magnetic oscillation layer (MOL) having an in-plane magnetization component, and a non-magnetic spacer (junction) layer formed between the MRL and MOL, said MRL has perpendicular magnetic anisotropy with a magnetization that is perpendicular to said film plane;
   (b) applying a DC current that flows in a direction from the MRL through the MOL and induces an oscillation state with a certain oscillation frequency within the MOL in-plane magnetization component;
   (c) applying a magnetic field having at least an in-plane component to said STO to produce an in-plane magnetization component within the MRL and a variable resistance across the STO; and
   (d) measuring a resulting AC voltage change from essentially zero before the applied magnetic field to a value substantially greater than zero that occurs from the variable resistance across the STO, said AC voltage change is directly related to the MOL oscillation frequency.

2. The method of claim 1 wherein said magnetic field is an entirely in-plane field having a magnetic field strength between 10 to 3000 Oe.

3. The method of claim 1 wherein said applied magnetic field includes a substantial perpendicular component that contributes to a total magnetic field strength, the applied magnetic field is removed after measuring the resulting AC voltage change.

4. The method of claim 3 wherein the in-plane component is less than 30% of total magnetic field strength.

5. The method of claim 3 wherein the in-plane component of said magnetic field has a magnetic field strength from 10 Oe to 3000 Oe.

6. The method of claim 3 wherein said perpendicular component assists said MOL to reach a desired oscillation state.

7. The method of claim 3 wherein the perpendicular component is applied in a direction from the MOL towards the MRL, or in the reverse direction.

8. The method of claim 1 further comprised of removing the applied magnetic field after the AC voltage measurement is complete to return the STO to a normal operating mode.

9. The method of claim 1 wherein applying a DC current and measuring the AC voltage comprises a first connection between said MRL and a first electrical contact, and a second connection between said MOL and a second electrical contact.

10. The method of claim 1 wherein said junction layer comprises Cu in a giant magnetoresistive (GMR) configuration.

11. A method to characterize the frequency of a spin torque oscillator (STO) structure, comprising:
   (a) providing a STO including at least a magnetic reference layer (MRL) having a film plane, a magnetic oscillation layer (MOL) having an in-plane magnetization component, and a non-magnetic spacer (junction) layer that has a first interface with the MRL and a second interface with the MOL; said MRL has perpendicular magnetic anisotropy that is perpendicular to said film plane;
   (b) providing first and second soft magnetic poles wherein said first magnetic pole is separated from the MRL by a first non-magnetic conductive spacer formed on a side of the MRL opposite the first interface, and the second magnetic pole is separated from the MOL by a second non-magnetic conductive spacer formed on a side of the MOL opposite the second interface;
   (c) applying a DC current that flows in a direction from the MRL through the MOL and induces an oscillation state with a certain oscillation frequency within the MOL in-plane magnetization component;
   (d) applying a magnetic field having in-plane and perpendicular components to said STO to produce an in-plane magnetization component within the MRL and a variable resistance across the STO;
   (e) measuring an AC voltage change that occurs as a result of the variable resistance across the STO, said AC voltage change is directly related to the MOL oscillation frequency; and
   (f) removing the applied magnetic field after the AC voltage change is measured.

12. The method of claim 11 wherein the magnetic field is applied by the first and second magnetic poles.

13. The method of claim 11 wherein the in-plane component of the applied magnetic field has a magnetic field strength between 10 Oe and 3000 Oe.

14. The method of claim 11 further comprised of removing the applied magnetic field after the measurement is completed thereby returning the STO structure to a normal operating mode.

15. The method of claim 11 wherein applying a DC current and measuring the AC voltage comprises a first connection between said first magnetic pole and a first electrical contact, and a second connection between said second magnetic pole and a second electrical contact.

16. The method of claim 11 wherein applying a DC current and measuring the AC voltage is accomplished by employing said first magnetic pole as a first electrical contact, and said second magnetic pole as a second electrical contact.

17. The method of claim 11 wherein the MOL, junction layer, MRL, and first and second non-magnetic conductive spacers have a common sidewall that is essentially planar.

18. The method of claim 11 wherein the first and second magnetic poles are part of an electromagnet and said magnetic poles are magnetized by applying a current to the electromagnet.

19. The method of claim 11 wherein the first and second magnetic poles are magnetized by applying an external magnetic field.

20. The method of claim 11 wherein the perpendicular component of the applied magnetic field is applied in a direction from the first magnetic pole toward the second magnetic pole, or in the reverse direction.

* * * * *